United States Patent
Hao et al.

(10) Patent No.: US 12,490,482 B2
(45) Date of Patent: Dec. 2, 2025

(54) SEMICONDUCTOR DEVICE HAVING IMPROVED P-TYPE DOPED NITRIDE-BASED SEMICONDUCTOR LAYER AND METHOD FOR MANUFACTURING THE SAME

(71) Applicant: INNOSCIENCE (SUZHOU) TECHNOLOGY CO., LTD., Suzhou (CN)

(72) Inventors: Ronghui Hao, Suzhou (CN); Chuan He, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 48 days.

(21) Appl. No.: 17/598,893

(22) PCT Filed: Sep. 7, 2021

(86) PCT No.: PCT/CN2021/116885
§ 371 (c)(1),
(2) Date: Mar. 16, 2023

(87) PCT Pub. No.: WO2023/035104
PCT Pub. Date: Mar. 16, 2023

(65) Prior Publication Data
US 2024/0047527 A1 Feb. 8, 2024

(51) Int. Cl.
*H10D 30/00* (2025.01)
*H01L 21/225* (2006.01)
(Continued)

(52) U.S. Cl.
CPC ....... *H10D 62/149* (2025.01); *H01L 21/2258* (2013.01); *H10D 30/015* (2025.01);
(Continued)

(58) Field of Classification Search
CPC .. H10D 30/015; H10D 30/471; H10D 30/472; H10D 30/475; H10D 62/121; H01L 21/2258
See application file for complete search history.

(56) References Cited

U.S. PATENT DOCUMENTS

| | | | |
|---|---|---|---|
| 10,833,159 B1 * | 11/2020 | Hao | ............... H10D 30/4732 |
| 2004/0004225 A1 | 1/2004 | Sung et al. | |

(Continued)

FOREIGN PATENT DOCUMENTS

| | | |
|---|---|---|
| CN | 101794814 A | 8/2010 |
| CN | 103715241 A | 4/2014 |

(Continued)

OTHER PUBLICATIONS

First Office Action of the corresponding China patent application No. 202180004136.8 mailed on Jul. 12, 2022.
(Continued)

*Primary Examiner* — Reema Patel
(74) *Attorney, Agent, or Firm* — Li & Cai Intellectual Property (USA) Office

(57) ABSTRACT

A semiconductor device includes a first and a second nitride-based semiconductor layers, a first p-type doped nitride-based semiconductor layer, a first and a second electrodes. The first p-type doped nitride-based semiconductor layer is disposed above the second nitride-based semiconductor layer and has a bottom surface in contact with the second nitride-based semiconductor layer. The first p-type doped nitride-based semiconductor layer has a hydrogen concentration which decrementally decreases along a direction pointing from the bottom surface toward a top surface of the first p-type doped nitride-based semiconductor layer. The first electrode is disposed on the first p-type doped nitride-based semiconductor layer and in contact with the top surface of the first p-type doped nitride-based semiconductor layer. The second electrode is disposed above the second nitride-based semiconductor layer to define a drift region.

20 Claims, 9 Drawing Sheets

(51) Int. Cl.
*H10D 30/01* (2025.01)
*H10D 30/47* (2025.01)
*H10D 62/13* (2025.01)
*H10D 62/85* (2025.01)
*H10D 64/62* (2025.01)

(52) U.S. Cl.
CPC ........... *H10D 30/475* (2025.01); *H10D 62/85* (2025.01); *H10D 64/62* (2025.01); *H10D 62/8503* (2025.01)

(56) References Cited

U.S. PATENT DOCUMENTS

2010/0193839 A1  8/2010  Takatani
2020/0119178 A1  4/2020  Okita et al.

FOREIGN PATENT DOCUMENTS

| CN | 112768519 A | 5/2021 | |
|---|---|---|---|
| JP | 11354458 A | 12/1999 | |
| JP | 200275910 A | 3/2002 | |
| KR | 20020005271 A  * | 1/2002 | ........... H01L 21/223 |

OTHER PUBLICATIONS

International Search Report and Written Opinion of the corresponding PCT application No. PCT/CN2021/116885 mailed on Jun. 8, 2022.

Jianfei Jiang, "common knowledge of Heterojunction field effect transistor", Nanochip Science, p. 41-42, Dec. 31, 2007.

China Patent Office, Decision of Rejection issued on Oct. 11, 2022.

China Patent Office, Notice of Reexamination issued on Jul. 25, 2023.

* cited by examiner

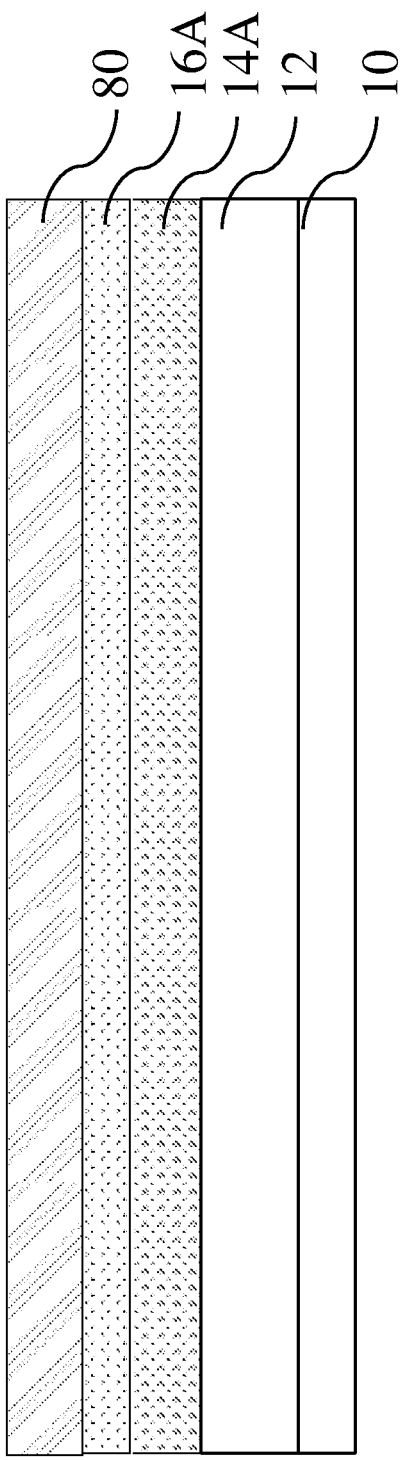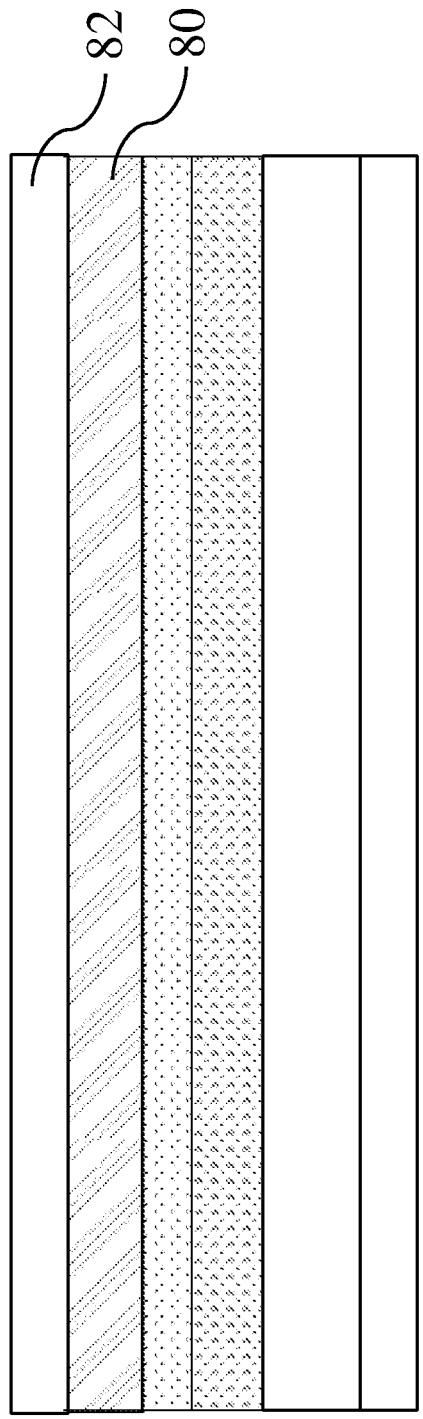
FIG. 3A
FIG. 3B

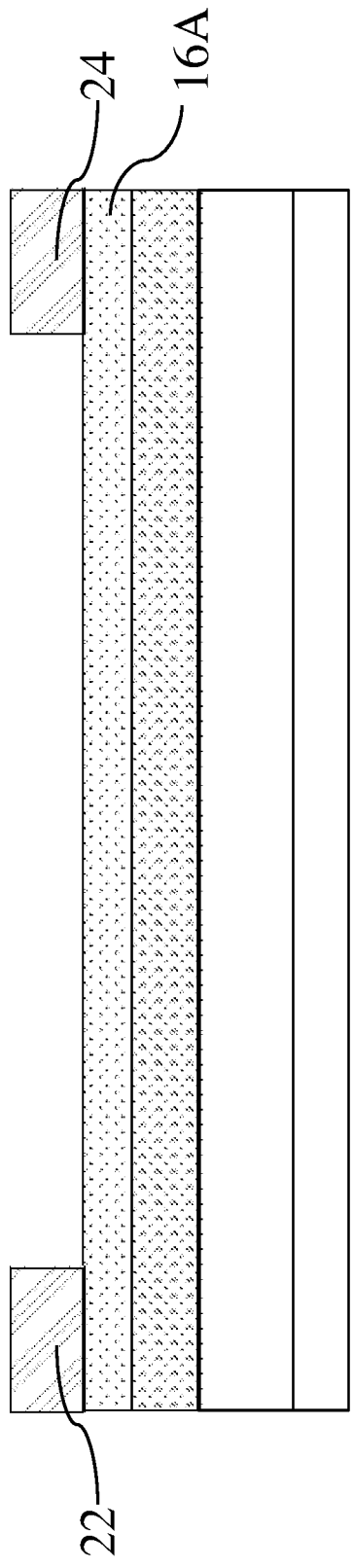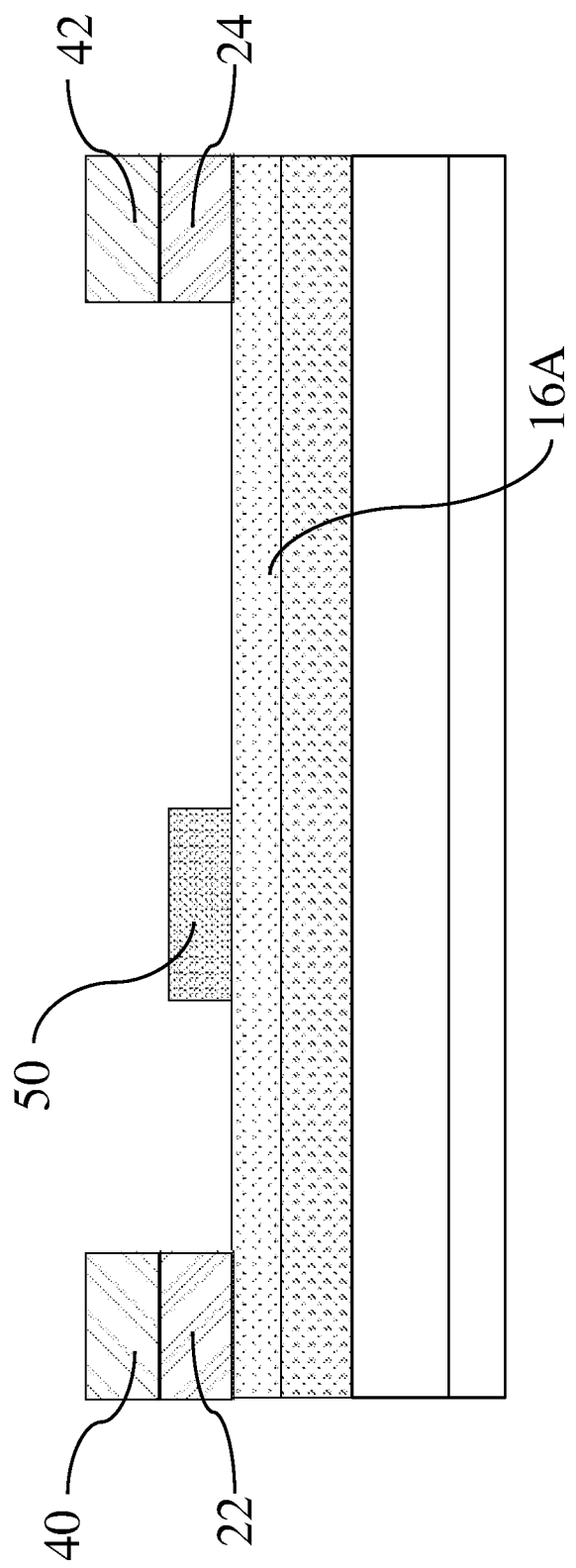

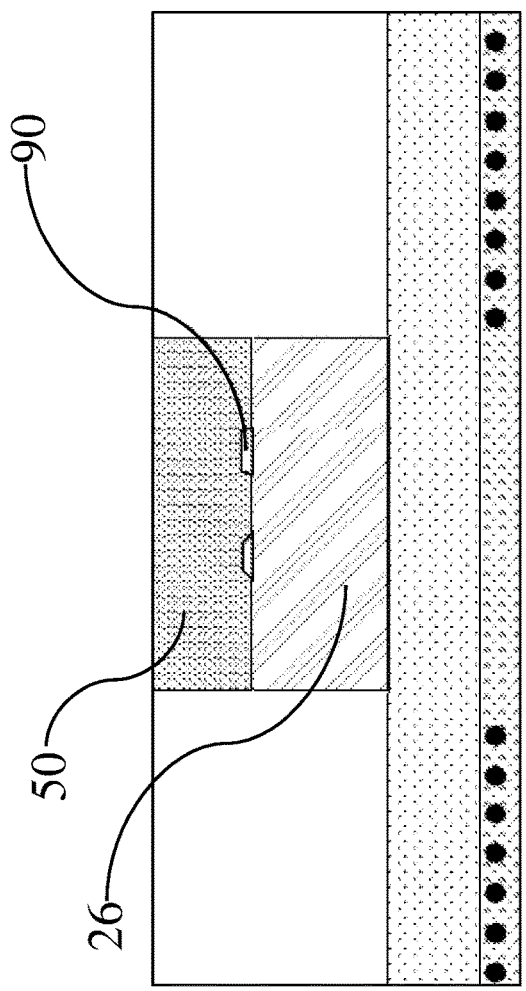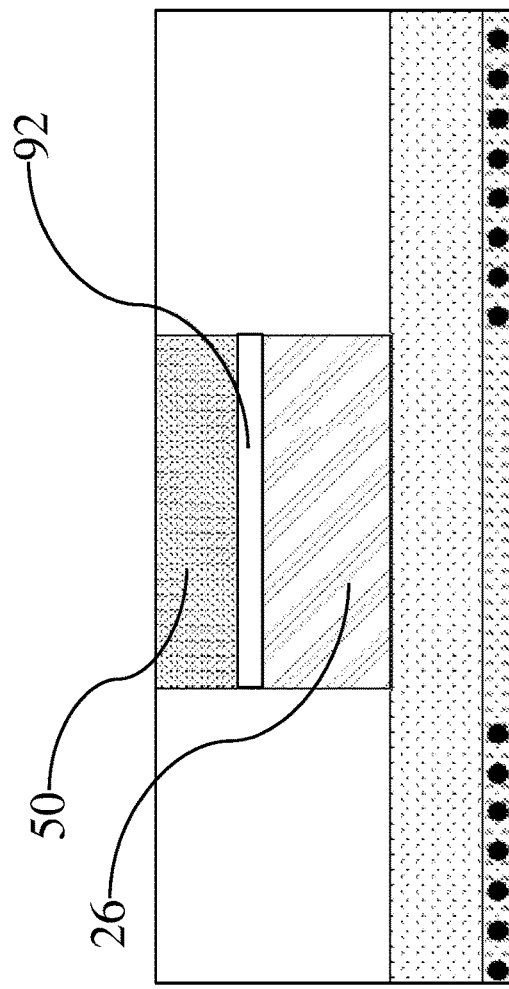

SEMICONDUCTOR DEVICE HAVING IMPROVED P-TYPE DOPED NITRIDE-BASED SEMICONDUCTOR LAYER AND METHOD FOR MANUFACTURING THE SAME

FIELD OF THE INVENTION

The present invention generally relates to a nitride-based semiconductor device. More specifically, the present invention relates to a III-nitride-based semiconductor device having an improved/modified p-type doped nitride-based semiconductor layer with a decrementally decreasing hydrogen concentration distribution.

BACKGROUND

Nitrogen-based III-V semiconductors are of considerable interest due to their unique electronic and mechanical properties. They are wide-band-gap semiconductors which possess a direct gap band and high thermal stability. In recent years, intense research on gallium nitride (GaN) has been prevalent, particularly for high power switching and high frequency applications, such as high-hole-mobility transistors (HHMTs) and high-electron-mobility transistors (HEMTs).

With respect to practical demands, there is a need to apply a p-type doped GaN material with high hole concentrations in the GaN-based devices. However, due to manufacturing factors, it is difficult to obtain p-type doped GaN with high hole concentrations. Specifically, during the formation of the p-type doped GaN, hydrogen ($H_2$) gas is usually used as carrier gas. The p-type dopants/acceptors, for example, Mg, can form a very stable complex with an incorporated hydrogen, thereby being passivated. The existence of the Mg—H complex seriously affects the electrical properties of the p-type doped GaN, which limits the applications of the GaN-based devices. Also, the hole concentration distribution of the p-type doped GaN may affect the electrical properties thereof.

SUMMARY OF THE INVENTION

In accordance with one aspect of the present disclosure, a semiconductor device is provided. The semiconductor device includes a first nitride-based semiconductor layer, a second nitride-based semiconductor layer, a first p-type doped nitride-based semiconductor layer, a first electrode, and a second electrode. The second nitride-based semiconductor layer is disposed on the first nitride-based semiconductor layer and has a bandgap different than a bandgap of the first nitride-based semiconductor layer to form a heterojunction therebetween. The first p-type doped nitride-based semiconductor layer is disposed above the second nitride-based semiconductor layer and has a bottom surface in contact with the second nitride-based semiconductor layer. The first p-type doped nitride-based semiconductor layer has a hydrogen concentration which decrementally decreases along a direction pointing from the bottom surface toward a top surface of the first p-type doped nitride-based semiconductor layer. The first electrode is disposed on the first p-type doped nitride-based semiconductor layer and in contact with the top surface of the first p-type doped nitride-based semiconductor layer. The second electrode is disposed above the second nitride-based semiconductor layer to define a drift region.

In accordance with one aspect of the present disclosure, a method for manufacturing a semiconductor structure is provided. The method includes steps as follows. A first nitride-based semiconductor layer is formed. A second nitride-based semiconductor layer is formed on the first nitride-based semiconductor layer to form a heterojunction therebetween. A blanket p-type doped nitride-based semiconductor layer is formed above the second nitride-based semiconductor layer. A hydrogen absorption layer is formed above the blanket p-type doped nitride-based semiconductor layer. A process temperature varies such that hydrogen in the blanket p-type doped nitride-based semiconductor layer is absorbed by the hydrogen absorption layer. The hydrogen absorption layer is removed. The blanket p-type doped nitride-based semiconductor layer is patterned to form a p-type doped nitride-based semiconductor layer. The first electrode is formed to be in contact with the p-type doped nitride-based semiconductor layer.

In accordance with one aspect of the present disclosure, a semiconductor device is provided. The semiconductor device includes a first nitride-based semiconductor layer, a second nitride-based semiconductor layer, a p-type doped nitride-based semiconductor layer, a first electrode, and a second electrode. The second nitride-based semiconductor layer is disposed on the first nitride-based semiconductor layer and has a bandgap different than a bandgap of the first nitride-based semiconductor layer to form a heterojunction therebetween. The p-type doped nitride-based semiconductor layer is disposed above the second nitride-based semiconductor layer and has a bottom surface in contact with the second nitride-based semiconductor layer. The p-type doped nitride-based semiconductor layer includes Mg—H complexes which are decreasingly distributed from the bottom surface to a top surface thereof. The first electrode is disposed on the p-type doped nitride-based semiconductor layer and in contact with the top surface of the p-type doped nitride-based semiconductor layer. The second electrode is disposed above the second nitride-based semiconductor layer to define a drift region between the first and second electrodes.

By forming a hydrogen absorption layer on a top surface of the p-type doped nitride-based semiconductor layer, the distribution of hydrogen/Mg—H complex concentration can be modified to be decrementally decreased along a direction pointing from the bottom surface toward the top surface thereof. More p-type dopants/acceptors can be activated by the hydrogen absorption layer, and thus more holes can be released. The top surface of the p-type doped nitride-based semiconductor layer can serve as a contact surface to the electrode. Since more holes are released and the hole concentration is improved, a better electrical contact between the p-type doped nitride-based semiconductor layer and the electrode can be achieved.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 3A, FIG. 3B, FIG. 3C and FIG. 3D show different stages of a method for manufacturing a nitride-based semiconductor device according to some embodiments of the present disclosure;

FIG. 4B is an enlarged vertical cross-sectional view of a region C in FIG. 4A;

FIG. 4C is an enlarged vertical cross-sectional view of a region of a semiconductor device according to some embodiments of the present disclosure.

DETAILED DESCRIPTION

Figure 1A:
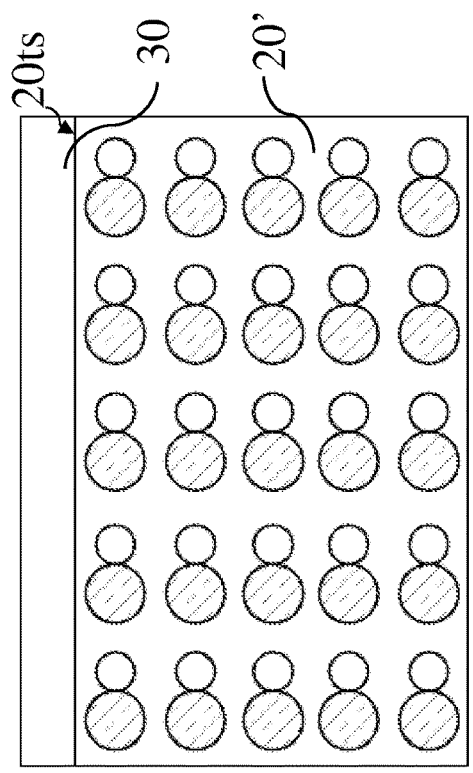
FIG. 1A, FIG. 1B, FIG. 1C, and FIG. 1D show different stages of an activation mechanism according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In order to increase hole concentration of a p-type doped nitride-based semiconductor layer, a manner for activating p-type impurities or acceptors therein is provided. FIGS. 1A, FIG. 1B, FIG. 1C and FIG. 1D show different stages of an activation mechanism according to some embodiments of the present disclosure. The detailed mechanism is fully described as follows.

FIG. 1A shows an inactivated p-type doped nitride-based semiconductor layer 20'. In some embodiments, the inactivated p-type doped nitride-based semiconductor layer 20' includes a low activated state. In the exemplary illustration of FIG. 1A, the exemplary materials of the p-type doped nitride-based semiconductor layer 20' can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity/dopant 201a, such as Be, Zn, Cd, and Mg. In the embodiment, the p-type doped nitride-based semiconductor layer 20' can formed as a p-type GaN layer. The p-type impurity/dopant 201a can be, for example, Mg.

Due to the manufacturing factors, residual hydrogen 201b may remain in the p-type doped nitride-based semiconductor layer 20'. The residual hydrogen 201b will react with the p-type impurity/dopant 201a. For example, as the p-type impurity/dopant 201a includes Mg, Mg—H complexes 201 is formed in the p-type doped nitride-based semiconductor layer 20'. The release of the holes will be limited/inhibited by the existence of the residual hydrogen 201b so hole concentration of the p-type doped nitride-based semiconductor layer 20' is confined as well.

In view of the afore-mentioned issue of the excessive low hole concentrations in the p-type doped nitride-based semiconductor layer 20', a rapid thermal annealing (RTA) process is one of the candidates for curing the issue. The RTA process can be configured to activate p-type impurity/dopant in a p-type doped nitride-based semiconductor layer. Nevertheless, due to high thermal activation energy of Mg (e.g., 150-200 meV), only a very small portion of Mg (about 1%) can be activated after the RTA process, so the RTA process still cannot comply the demand regarding making Mg acceptor release more holes.

In order to enhance the activation rate of p-type impurity/dopant, the present disclosure provides a novel way to activate the p-type impurity/dopant (e.g., Mg) in a p-type doped GaN material.

Figure 1B:
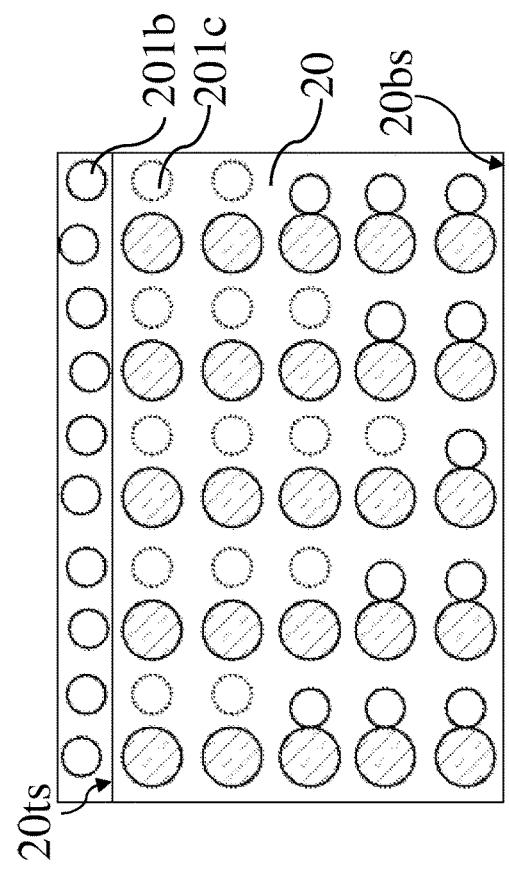

Referring to FIG. 1B, a hydrogen absorption layer 30 can be formed on a top surface 20ts of the p-type doped nitride-based semiconductor layer 20'. In some embodiments, the hydrogen absorption layer 30 has a thickness in a range from about 50 nm to about 1000 nm, and thus the hydrogen absorption layer 30 can be called a hydrogen absorption thin film.

Figure 1C:
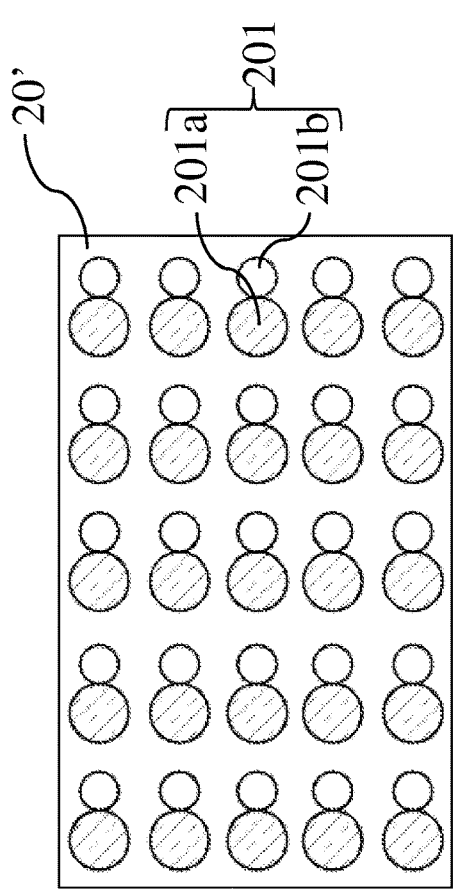

Referring to FIG. 1C, after the formation of the hydrogen absorption layer 30, the intermolecular bonds of some of the Mg—H complexes 201 would be desorbed to activate the p-type impurity/dopant 201a by the hydrogen absorption layer 30. As such, the hydrogen 201b in the p-type doped nitride-based semiconductor layer 20' can move toward the hydrogen absorption layer 30 through the top surface 20ts. In some embodiments, after the formation of the hydrogen absorption layer 30, a functional/an additional treatment is performed, so as to push the hydrogen 201b in the p-type doped nitride-based semiconductor layer 20' into the hydrogen absorption layer 30. The functional/additional treatment involves with varying a process temperature.

In some embodiments, the hydrogen absorption layer 30 can include, for example, but is not limited to, metal materials. For example, the metal materials can include, but is not limited to, Ti, Zr, Ca, Mg, V, Nb, Re, or combinations/ alloys thereof. The afore-mentioned metal materials can react with the hydrogen 201b to form a stable metal hydride in the hydrogen absorption layer 30. For example, the hydrogen absorption layer can include Ti, and the Ti can react with the hydrogen 201b, thereby forming metal hydride $TiH_2$ in the hydrogen absorption layer 30. The advantage for adopting the afore-mentioned metal materials is that they have high hydrogen storage capacity, and the hydrogen 201b can be effectively absorbed.

In some embodiments, the hydrogen absorption layer 30 can include, for example, but is not limited to, $KHCO_3$, $NaHCO_3$, $Li_3N$, or combinations thereof.

In some embodiments, the hydrogen absorption layer 30 can include, for example, but is not limited to, Al—Ni nanoparticles. As compared to the bulk material, the surface adsorption phenomenon can be remarkable due to high specific surface area of Al—Ni nanoparticles, which is advantageous to enhance the hydrogen absorbing ability of the hydrogen absorption layer 30.

In some embodiments, the hydrogen absorption layer 30 can include, for example, but is not limited to, activated carbon, graphitized carbon nanofiber, carbon nanotube, or combinations thereof. The afore-mentioned carbide in the hydrogen absorption layer 30 can absorb hydrogen 201b to the surfaces thereof by Van der Waals force generated therebetween. The advantage for adopting the afore-mentioned carbide is that the required reaction temperature can be low.

In some embodiments, the hydrogen absorption layer 30 can include, for example, but is not limited to, gas hydrates. The gas hydrates in the hydrogen absorption layer 30 can form intermolecular hydrogen bond with the hydrogen 201b in the hydrogen absorption layer 30. The advantage for adopting the afore-mentioned gas hydrates is that the required reaction temperature can be low.

Figure 1D:
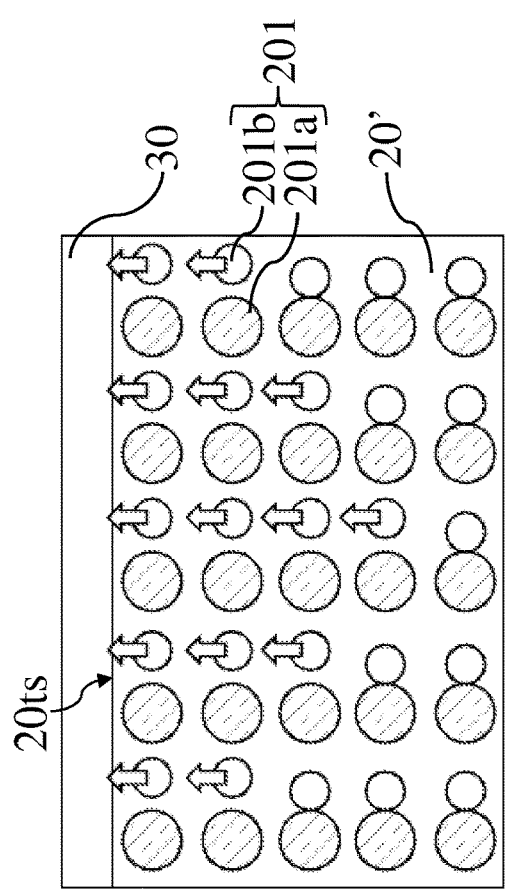

Referring to FIG. 1D, after a certain period of time, the hydrogen absorption layer 30 and the p-type doped nitride-based semiconductor layer can reach the equilibrium. Some of the hydrogen 201b can be stored in the hydrogen absorption layer 30. Thus, an improved/modified p-type doped nitride-based semiconductor layer 20 is obtained.

As compared to an RTA annealed p-type doped nitride-based semiconductor layer, the applying of the hydrogen absorption layer 30 can effectively activate the p-type impurity/dopant 201a, and the activation rate thereof can be greatly enhanced. Accordingly, by pushing the hydrogen 201b from the p-type doped nitride-based semiconductor layer 20 to the hydrogen absorption layer 30, more holes 201c in the p-type doped nitride-based semiconductor layer 20 are released, so as to improve the hole concentration of the p-type doped nitride-based semiconductor layer 20.

As result, along a vertical direction, a hydrogen concentration decrementally decreases along a direction pointing from a bottom surface toward the top surface 20ts. The bottom surface 20ts and the top surface 20ts of the p-type doped nitride-based semiconductor layer 20 are opposite. Furthermore, the Mg—H complexes 201 are decreasingly distributed from the bottom surface 24s to the top surface 20ts. In the other point of view, the hole concentration of the p-type doped nitride-based semiconductor layer 20 decrementally increases along the direction pointing from the bottom surface 24s toward the top surface 20ts. Since the region adjacent to the top surface 20ts can have a higher hole concentration than the remaining region thereof, an ohmic contact can be formed between the improved/modified p-type doped nitride-based semiconductor layer 20 and an electrode to be formed in contact with the top surface 20ts.

Moreover, along a horizontal direction, the hydrogen concentration of the p-type doped nitride-based semiconductor layer 20 is horizontally uniform at or near its top surface 20ts. Therefore, the p-type doped nitride-based semiconductor layer 20 can have uniform improved hole concentration at or near its top surface 20ts, which further improves the contact condition for the top surface 20ts of the p-type doped nitride-based semiconductor layer 20.

The improved/modified p-type doped nitride-based semiconductor layer 20 can be applied to different nitride-based devices, such as high-electron-mobility transistors (HEMTs) and high-hole-mobility transistors (HHMTs).

In this regard, the properties/characters of the hydrogen absorption layer are compatible with HEMT/HHMT devices. Herein, the phrase "being compatible with HEMT/HHMT devices" includes the process for absorbing hydrogen from p-type doped nitride-based semiconductor layer to the hydrogen absorption layer is compatible. The process for absorbing hydrogen can be started from increase in the process temperature, which is called a functional treatment or an additional treatment. The process temperature is relatively low. For example, the functional treatment or the additional treatment is performed in a temperature range from about 50° C. to about 900° C. For HEMT/HHMT devices, existing layers thereof can be free from thermal damage during the treatment. Moreover, the properties of some of the materials applied to the hydrogen absorption layer are stable at the operation of HEMT/HHMT devices, so they can remain in the final structure of the HEMT/HHMT devices.

Therefore, it can be found applying the hydrogen absorption layer into HEMT/HHMT devices is advantageous to improve device performance due to increasing hole concentration, and the compatibility can have devices work stably still. The present disclosure is to provide how to apply hydrogen absorption layers to combination with HEMT/HHMT devices. The exemplary devices can have the improved/modified p-type doped nitride-based semiconductor layer 20 as described as follows.

Figure 2A:
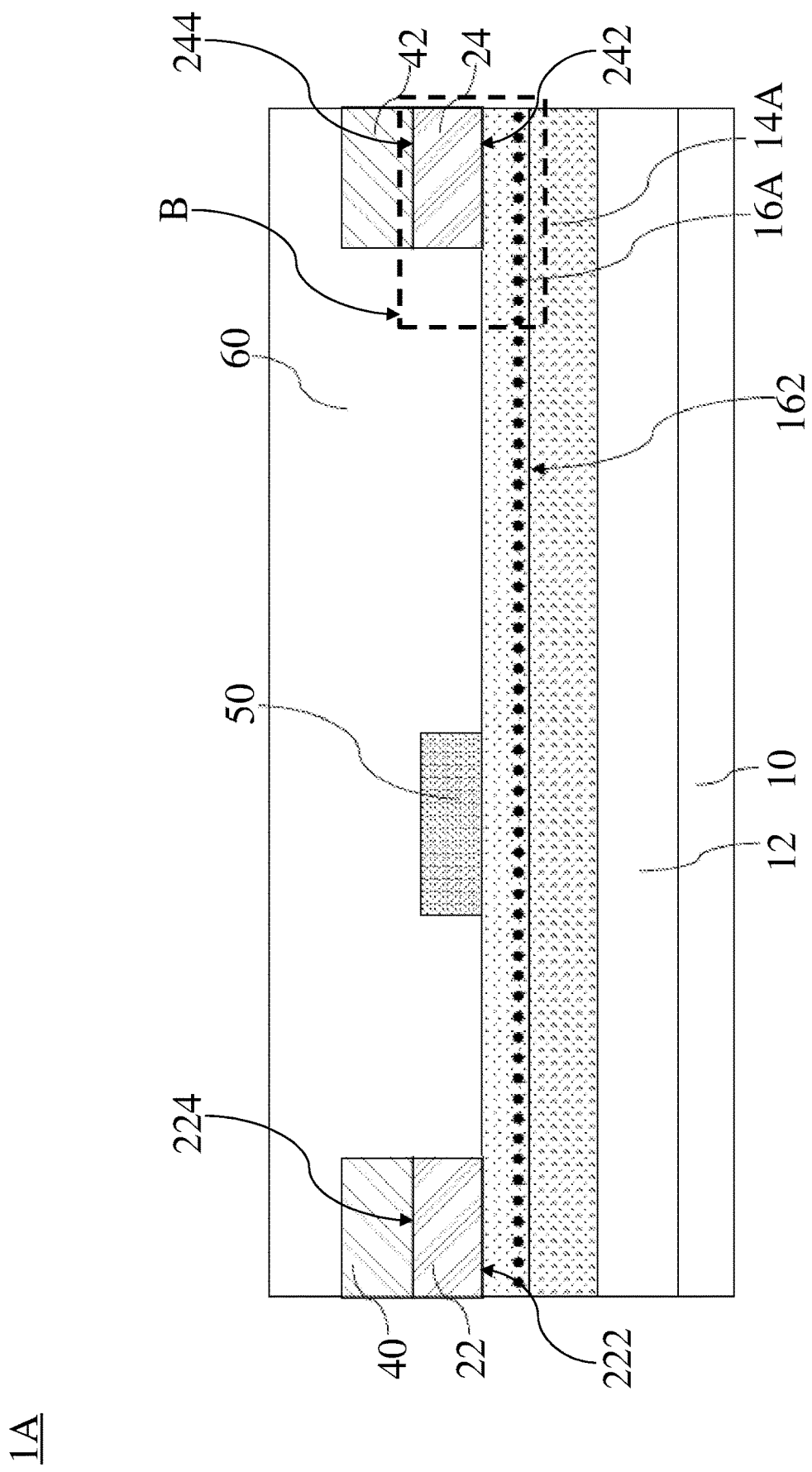
FIG. 2A is a vertical cross-sectional view of a semiconductor device according to some embodiments of the present disclosure.

FIG. 2A is a vertical cross-sectional view of a semiconductor device 1A according to some embodiments of the present disclosure. The semiconductor device 1A includes a HHMT device. The semiconductor device 1A includes a substrate 10, a buffer layer 12, nitride-based semiconductor layers 14A and 16A, the improved/modified p-type doped nitride-based semiconductor layer 22 and 24, electrodes 40 and 42, a gate electrode 50, and a passivation layer 60.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The buffer layer 12 can be disposed on/over/above the substrate 10. The buffer layer 12 can be disposed between the substrate 10 and the nitride-based semiconductor layer 14A. The buffer layer 12 can be configured to reduce lattice and thermal mismatches between the substrate 10 and the nitride-based semiconductor layer 14A, thereby curing defects due to the mismatches/difference. The buffer layer 12 may include a III-V compound. The III-V compound can include, for example but are not limited to, aluminum, gallium, indium, nitrogen, or combinations thereof. Accordingly, the exemplary materials of the buffer layer 12 can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and the buffer layer 12. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 14A is disposed on/over/above the buffer layer 12. The nitride-based semiconductor layer 16A is disposed on/over/above the nitride-based semiconductor layer 14A. The exemplary materials of the nitride-based semiconductor layer 14A can include, for example but are not limited to, nitrides or group III-V compounds, such as GaN, AlN, InN, $In_xAl_yGa_{(1-x-y)}N$ where x+y≤1, $Al_xGa_{(1-x)}N$ where x≤1. The exemplary materials of the nitride-based semiconductor layer 16A can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 14A and 16A are selected such that the nitride-based semiconductor layer 16A has a bandgap (i.e., forbidden band width) less than a bandgap of the nitride-based semiconductor layer 14A, which causes electron affinities thereof different from each other and forms a heterojunction therebetween. For example, when the nitride-based semiconductor layer 14A is an AlGaN layer having bandgap of approximately 4.0 eV, and the nitride-based semiconductor layer 16A can be selected as an undoped GaN layer having a bandgap of approximately 3.4 eV. As such, the nitride-based semiconductor layers 14A and 16A can serve as a barrier layer and a channel layer, respectively. A triangular well potential is generated at a bonded interface between the channel and barrier layers, so that electrons accumulate in the triangular well, thereby generating a two-dimensional hole gas (2DHG) region 162 adjacent to the heterojunction. Accordingly, the semiconductor device 1A is available to include at least one GaN-based high-hole-mobility transistor (HHMT).

The improved/modified p-type doped nitride-based semiconductor layers 22 and 24 can be disposed on/over/above the nitride-based semiconductor layer 16A. The improved/modified p-type doped nitride-based semiconductor layers 22 and 24 can be in contact with the nitride-based semiconductor layer 16A through their bottom surfaces 222 and 242, respectively. The improved/modified p-type doped nitride-based semiconductor layers 22 and 24 can be identical or similar to the improved/modified p-type doped nitride-based semiconductor layer 20 in FIG. 1D. That is, the improvement is made on the hole concentrations of the p-type doped nitride-based semiconductor layers 22 and 24.

In some embodiments, the electrode 40 can serve as a source electrode. In some embodiments, the electrode 40 can serve as a drain electrode. In some embodiments, the electrode 42 can serve as a source electrode. In some embodiments, the electrode 42 can serve as a drain electrode. The role of the electrodes 40 and 42 depends on the device design.

The electrode 40 can be disposed on/over/above the improved/modified p-type doped nitride-based semiconductor layer 22. The electrode 40 can be in contact with the top surface 224 of the improved/modified p-type doped nitride-based semiconductor layer 22. The electrode 42 can be disposed on/over/above the improved/modified p-type doped nitride-based semiconductor layer 24. The electrode 42 can be in contact with the top surface 244 of the improved/modified p-type doped nitride-based semiconductor layers 24. A drift region (e.g., 2DHG region 162) is defined between the electrodes 40 and 42.

Due to the introduction of the improved/modified p-type doped nitride-based semiconductor layers 22 and 24, a good ohmic contact can be formed between the improved/modified p-type doped nitride-based semiconductor layer and the corresponded electrode. Therefore, the electrical properties of the semiconductor device 1A can be improved.

In some embodiments, the electrodes 40 and 42 can include, for example but are not limited to, metals, alloys, doped semiconductor materials (such as doped crystalline silicon), compounds such as silicides and nitrides, other conductor materials, or combinations thereof. The exemplary materials of the electrodes 40 and 42 can include, for example but are not limited to, Ti, AlSi, TiN, or combinations thereof. The electrodes 40 and 42 may be a single layer, or plural layers of the same or different composition. In some embodiments, each of the electrodes 40 and 42 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, Al Si, AlCu, or combinations thereof.

The gate electrode 50 can be disposed on/over/above the nitride-based semiconductor layer 16A. The gate electrode 50 is located between the electrodes 40 and 42. The electrode 40 is closer to the gate electrode 50 than the electrode 42. That is, the electrodes 40 and 42 can be arranged as being asymmetrical about the gate electrode 50. In some embodiments, the electrodes 40 and 42 can be arranged as being symmetrical about the gate electrode 50. The arrangement depends on different electrical property requirements.

The exemplary materials of the gate electrode 50 may include metals or metal compounds. The gate electrode 50 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

In the exemplary illustration of FIG. 2A, the semiconductor device 1A is a normally-on state when the gate electrode 50 is at approximately zero bias.

Figure 2C:
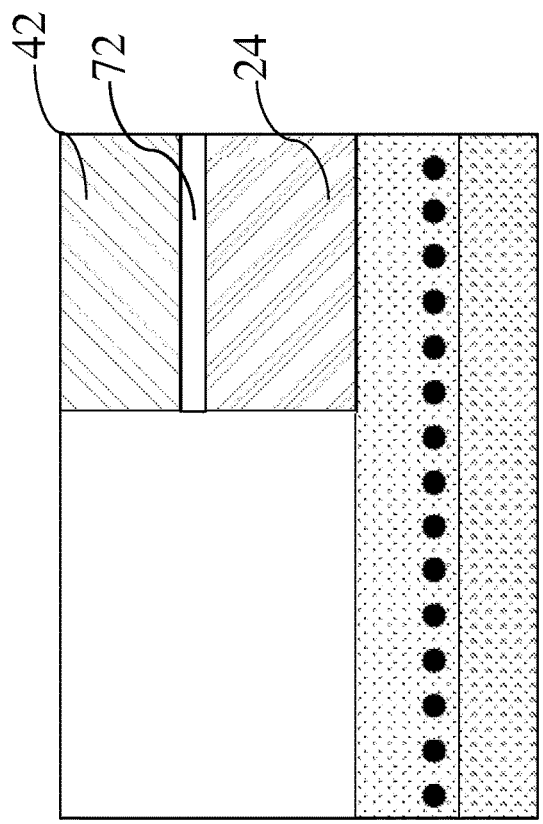
FIG. 2C is an enlarged vertical cross-sectional view of a region of a semiconductor device according to some embodiments of the present disclosure.
Figure 2B:
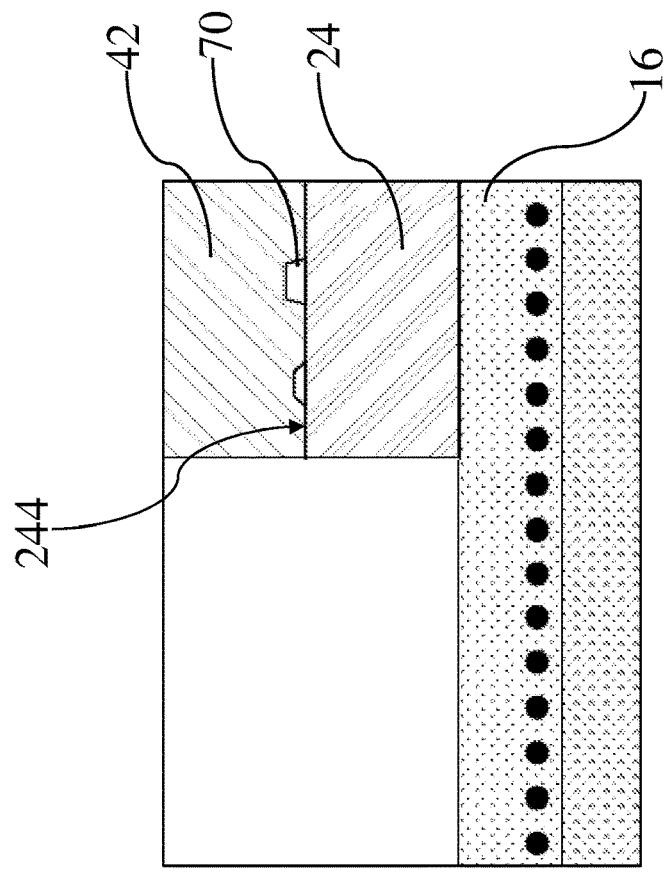
FIG. 2B is an enlarged vertical cross-sectional view of a region B in FIG. 1A.

FIG. 2B is an enlarged vertical cross-sectional view of a region B in FIG. 1A. Referring to FIG. 2B, in some embodiments, if the materials contained in the hydrogen absorption layer are non-conductive, such as $KHCO_3$, $NaHCO_3$, $Li_3N$, or combinations thereof. Then, at least for a purpose of avoiding affection to conductivity, the hydrogen absorption layer is optionally removed from the top surface 244 of the improved/modified p-type doped nitride-based semiconductor layer 24.

After the removing process, a very few portions of the hydrogen absorption layer possibly remain on the top surface 244, which can be referred as to hydrogen absorption islands 70. In some embodiments, the remained hydrogen absorption islands 70 can include, for example but are not limited to, KHCO$_3$, NaHCO$_3$, Li$_3$N, or combinations thereof. Then, the electrode 42 formed on the top surface 244 of the p-type doped nitride-based semiconductor layer 24 covers the hydrogen absorption islands 70. The hydrogen absorption islands 70 are disposed between the p-type doped nitride-based semiconductor layer 24 and the electrode 42. The identical configuration may occur in a region between the p-type doped nitride-based semiconductor layer 22 and the electrode 40.

Since the materials including include KHCO$_3$, NaHCO$_3$, Li$_3$N, or combinations thereof will not greatly affect the performance and operation of the HHMT in the semiconductor device 1A, such the hydrogen absorption islands 70 remaining in the structure is acceptable. The present disclosure is to provide how to specifically constitute a HHMT device applying hydrogen absorption islands into the structure thereof for the purpose of improvement to hole concentration.

In some embodiments involving that the materials of the hydrogen absorption layer are conductive, whether to remove the hydrogen absorption layer is optional. One of the factors whether to remove the hydrogen absorption layer is related to hydrogen stored in the hydrogen absorption layer. Since HHMT devices can be applied as a high voltage device or a low voltage device, whether to remove the hydrogen absorption layer can be made according to the affection of the hydrogen stored in the hydrogen absorption layer on the operation of high/low voltage.

Since the materials of the hydrogen absorption layer are conductive, it is acceptable once a very few portions of the hydrogen absorption layer remain on the top surface 244. Accordingly, the remained portions of the conductive hydrogen absorption layer can serve as hydrogen absorption islands 70.

In some embodiments, the remained hydrogen absorption islands 70 can include, for example but are not limited to, Ti, Zr, Ca, Mg, V, Nb, Re, or combinations thereof, such that the hydrogen absorption islands 70 can include metal hydride. In some embodiments, the remained hydrogen absorption islands 70 can include, for example but are not limited to, Al—Ni nanoparticles. In some embodiments, the remained hydrogen absorption islands 70 can include, for example but are not limited to, activated carbon, graphitized carbon nanofiber, carbon nanotube, or combinations thereof.

In alternative embodiments, an entirety of the hydrogen absorption layer remains. For example, FIG. 2C is an enlarged vertical cross-sectional view of a region of a semiconductor device according to some embodiments of the present disclosure. Referring to FIG. 2C, an entirety of the hydrogen absorption layer 72 remains between the p-type doped nitride-based semiconductor layer 24 and the electrode 42. The p-type doped nitride-based semiconductor layer 24 is entirely separated from electrode 42 by the hydrogen absorption layer 72. Since a process for removing the hydrogen absorption layer 72 is omitted, reduction of the manufacturing cost is achieved. In some embodiments, the hydrogen absorption layer 72 has a thickness in a range from about 50 nm to about 1000 nm. The range is set based on the conductivity of the structure.

Referring back to FIG. 2A, the passivation layer 60 can be disposed on/over/above the electrodes 42 and 44, the gate electrode 50 and the nitride-based semiconductor layer 16A. The material of the passivation layer 60 can include, for example but is not limited to, dielectric materials. The passivation layer 60 can serve as a planarization layer which has a level top surface to support other layers/elements. In some embodiments, the passivation layer 60 can be formed as being thicker, and a planarization process, such as a chemical mechanical polish (CMP) process, is performed on the passivation layer 60 to remove the excess portions, thereby forming a level top surface.

Different stages of a method for manufacturing the semiconductor device 1A are shown in FIG. 3A, FIG. 3B, FIG. 3C, and FIG. 3D, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Referring to FIG. 3A, a substrate 10 is provided. A buffer layer 12 is formed on/over/above the substrate 10 by using deposition techniques. A nitride-based semiconductor layer 14A is formed on/over/above the buffer layer 12 by using deposition techniques. A nitride-based semiconductor layer 16 is formed on/over/above the nitride-based semiconductor layer 14A by using deposition techniques to form a heterojunction therebetween. A blanket p-type doped nitride-based semiconductor layer 80 is formed on/over/above the nitride-based semiconductor layer 16A by using deposition techniques.

Referring to FIG. 3B, a hydrogen absorption layer 82 is formed on/over/above the blanket p-type doped nitride-based semiconductor layer 80. A functional treatment or an additional process is performed such that the process temperature is varied. As such, hydrogen in the blanket p-type doped nitride-based semiconductor layer 80 is absorbed by the hydrogen absorption layer 82, as the description with respect to FIG. 1A-FIG. 1D. Then, the hydrogen concentration distribution of the blanket p-type doped nitride-based semiconductor layer 80 can be modified by the hydrogen absorption layer 82. The materials of the hydrogen absorption layer 30 can be selected as afore-mentioned. In some embodiments, the hydrogen absorption layer 82 can have metal hydride after varying the process temperature.

Referring to FIG. 3C, the hydrogen absorption layer 82 is removed, so as to expose the top surface of the blanket p-type doped nitride-based semiconductor layer 80. In some embodiments, at least one hydrogen absorption island remains on the blanket p-type doped nitride-based semiconductor layer 80 after removing the hydrogen absorption layer 82. Thereafter, the blanket p-type doped nitride-based semiconductor layer 80 is patterned to form p-type doped nitride-based semiconductor layers 22 and 24 on/over/above the nitride-based semiconductor layer 16A.

Referring to FIG. 3D, electrodes 40 and 42 are formed on/over/above the nitride-based semiconductor layer 16A, so as to be in contact with the p-type doped nitride-based semiconductor layers 22 and 24, respectively. A drift region can be defined between the electrodes 40 and 42. A gate electrode 50 is formed on/over/above the nitride-based semiconductor layer 16A, and the gate electrode 50 is located between the electrodes 40 and 42. Thereafter, a passivation layer 60 can be formed, obtaining the configuration of the semiconductor device 1A as shown in FIG. 2A.

In embodiments involving with the p-type doped nitride-based semiconductor layers 22 and 24 entirely covered with the hydrogen absorption layer 82, the blanket p-type doped nitride-based semiconductor layer 80 and the hydrogen absorption layer 82 can be patterned altogether.

Figure 4A:
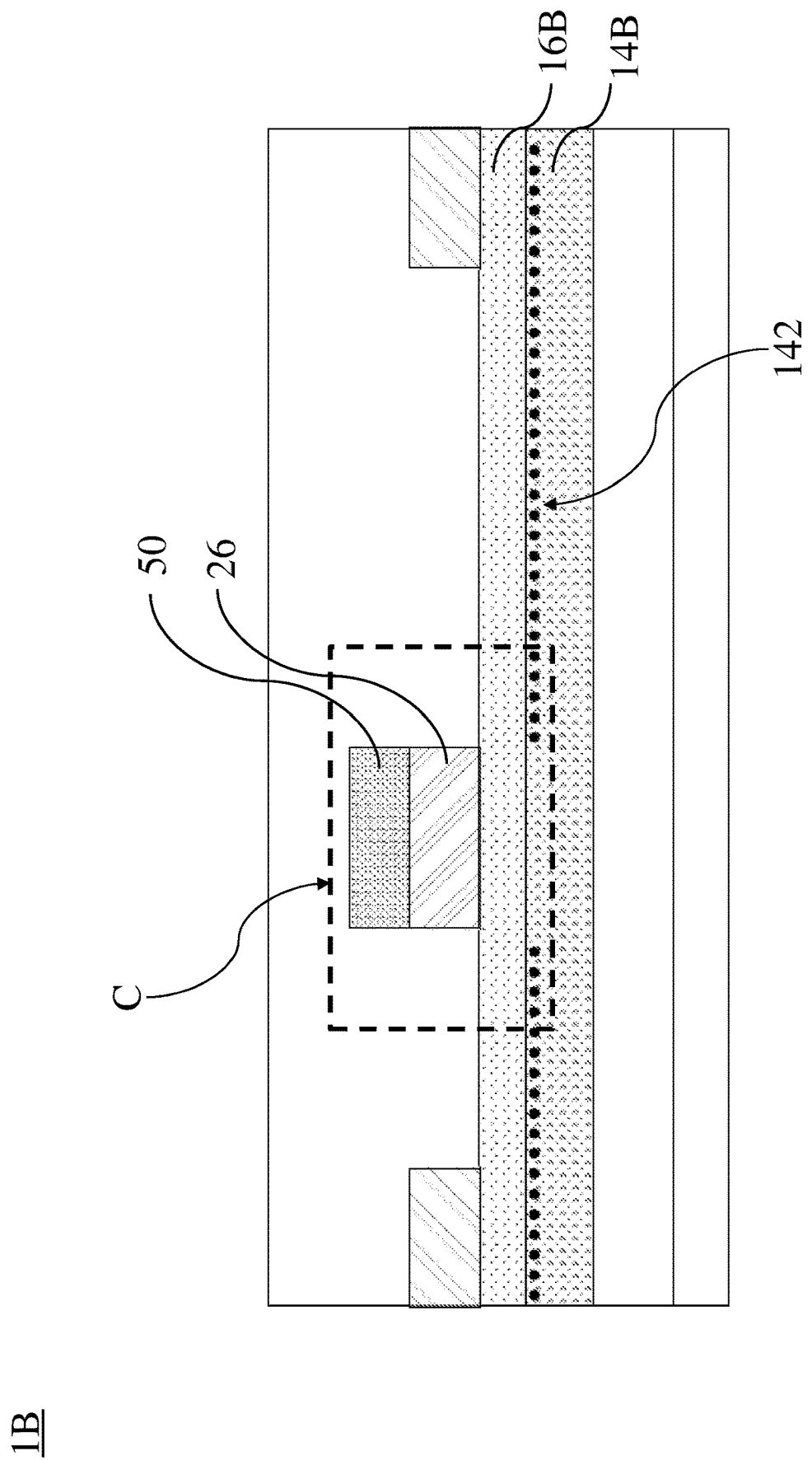
FIG. 4A is a vertical cross-sectional view of a semiconductor device according to some embodiments of the present disclosure.

FIG. 4A is a vertical cross-sectional view of a semiconductor device 1B according to some embodiments of the present disclosure. The semiconductor device 1B is similar to the semiconductor device 1A as described and illustrated with reference to FIG. 2A, except that a nitride-based semiconductor layer 16B has a bandgap greater than a bandgap of a nitride-based semiconductor layer 14B and that an improved/modified p-type doped nitride-based semiconductor layer 26 located between the gate electrode 50 and the nitride-based semiconductor layer 16B is introduced into the structure.

More specifically, the exemplary materials of the nitride-based semiconductor layers 14B and 16B are selected such that the nitride-based semiconductor layer 16B has a bandgap (i.e., forbidden band width) greater than a bandgap of the nitride-based semiconductor layer 14B, which causes electron affinities thereof different from each other and forms a heterojunction therebetween. For example, when the nitride-based semiconductor layer 14B is an undoped GaN layer having a bandgap of approximately 3.4 eV, and the nitride-based semiconductor layer 16B can be selected as an AlGaN layer having bandgap of approximately 4.0 eV. As such, the nitride-based semiconductor layers 14B and 16B can serve as a channel layer and a barrier layer, respectively. A triangular well potential is generated at a bonded interface between the channel and barrier layers, so that holes accumulate in the triangular well, thereby generating a two-dimensional electron gas (2DEG) region 142 adjacent to the heterojunction. Accordingly, the semiconductor device 1B is available to include at least one GaN-based high-hole-mobility transistor (HEMT).

The p-type doped nitride-based semiconductor layer 26 can be improved/modified by using a hydrogen absorption layer, as described with respect to FIGS. 1A-1D.

In the exemplary illustration of FIG. 4A, the semiconductor device 1B is an enhancement mode device, which is in a normally-off state when the gate electrode 50 is at approximately zero bias. Specifically, the improved/modified p-type doped nitride-based semiconductor layer 26 may create at least one p-n junction with the nitride-based semiconductor layer 14B to deplete the 2DEG region 142, such that zone of the 2DEG region 142 corresponding to position below the corresponding the gate electrode 50 have different characteristics (e.g., different hole concentrations) than the remaining of the 2DEG region 142 and thus is blocked. Due to the high hole concentration of the improved/modified p-type doped nitride-based semiconductor layer 26, the zone of 2DEG region 142 can be well/fully depleted, thereby reducing the off-state current.

Due to this mechanism, the semiconductor device 1B has a normally-off characteristic. In other words, when no voltage is applied to the gate electrode 50 or a voltage applied to the gate electrode 50 is less than a threshold voltage (i.e., a minimum voltage required to form an inversion layer below the gate electrode 50), the zone of the 2DEG region 142 below the gate electrode 50 is kept blocked, and thus no current flows therethrough.

Based on the same reason as afore described in FIGS. 2A-2C, whether to remove the applied hydrogen absorption layer on the improved/modified p-type doped nitride-based semiconductor layer 26 is optional. The option can be made according to the device design or the material properties/character of the applied hydrogen absorption layer.

FIG. 4B is an enlarged vertical cross-sectional view of a region C in FIG. 4A. As shown in the exemplary illustration of FIG. 4B, the hydrogen absorption islands 90 are located between the improved/modified p-type doped nitride-based semiconductor layer 26 and the gate electrode 50. The hydrogen absorption islands 90 can have the identical or similar materials as the hydrogen absorption islands 70 in FIG. 2B.

In alternative embodiments, an entirety of the hydrogen absorption layer remains. For example, FIG. 4C is an enlarged vertical cross-sectional view of a region of a semiconductor device according to some embodiments of the present disclosure. Referring to FIG. 4C, an entirety of the hydrogen absorption layer 92 remains between the p-type doped nitride-based semiconductor layer 26 and the gate electrode 50. Since a process for removing the hydrogen absorption layer 92 is omitted, reduction of the manufacturing cost is achieved. In some embodiments, the hydrogen absorption layer 92 has a thickness in a range from about 50 nm to about 1000 nm. The range is set based on the conductivity of the structure.

Different stages of a method for manufacturing the semiconductor device 1B are shown in FIG. 5A, FIG. 5B, FIG. 5C and FIG. 5D, as described below. In the following, deposition techniques can include, for example but are not limited to, ALD, PVD, CVD, MOCVD, PECVD, LPCVD, plasma-assisted vapor deposition, epitaxial growth, or other suitable processes.

Figure 5A:
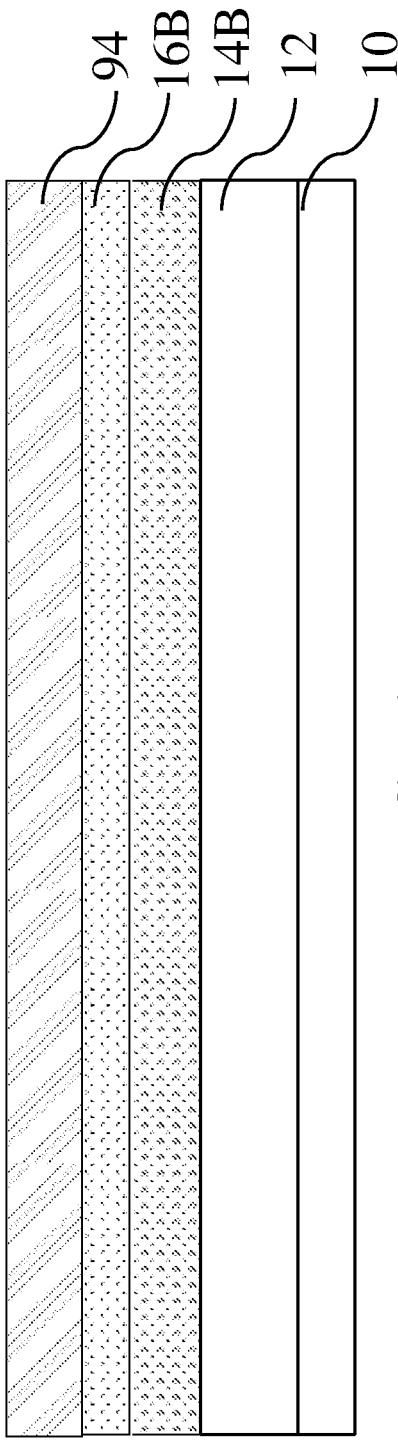
FIG. 5A, FIG. 5B, FIG. 5C, and FIG. 5D show different stages of a method for manufacturing a nitride-based semiconductor device according to some embodiments of the present disclosure.

Referring to FIG. 5A, a substrate 10 is provided. A buffer layer 12 is formed on/over/above the substrate 10 by using deposition techniques. A nitride-based semiconductor layer 14B is formed on/over/above the buffer layer 12 by using deposition techniques. A nitride-based semiconductor layer 16B is formed on/over/above the nitride-based semiconductor layer 14B by using deposition techniques to form a heterojunction therebetween. A blanket p-type doped nitride-based semiconductor layer 94 is formed on/over/above the nitride-based semiconductor layer 16B by using deposition techniques.

Figure 5B:
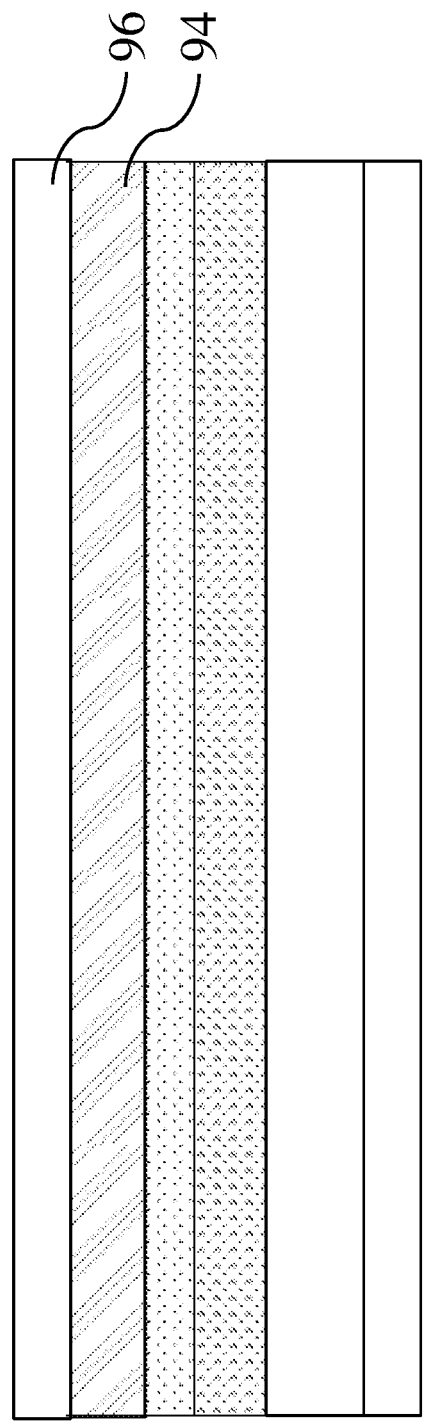

Referring to FIG. 5B, a hydrogen absorption layer 96 is formed on/over/above the blanket p-type doped nitride-based semiconductor layer 94. A functional treatment or an additional process is performed such that the process temperature is varied. As such, hydrogen in the blanket p-type doped nitride-based semiconductor layer 94 is absorbed by the hydrogen absorption layer 64, as the description with respect to FIG. 1A-FIG. 1D. Then, the hydrogen concentration distribution of the blanket p-type doped nitride-based semiconductor layer 94 can be modified by the hydrogen absorption layer 96. The materials of the hydrogen absorption layer 96 can be selected as afore-mentioned. In some embodiments, the hydrogen absorption layer 96 can have metal hydride after varying the process temperature.

Figure 5C:
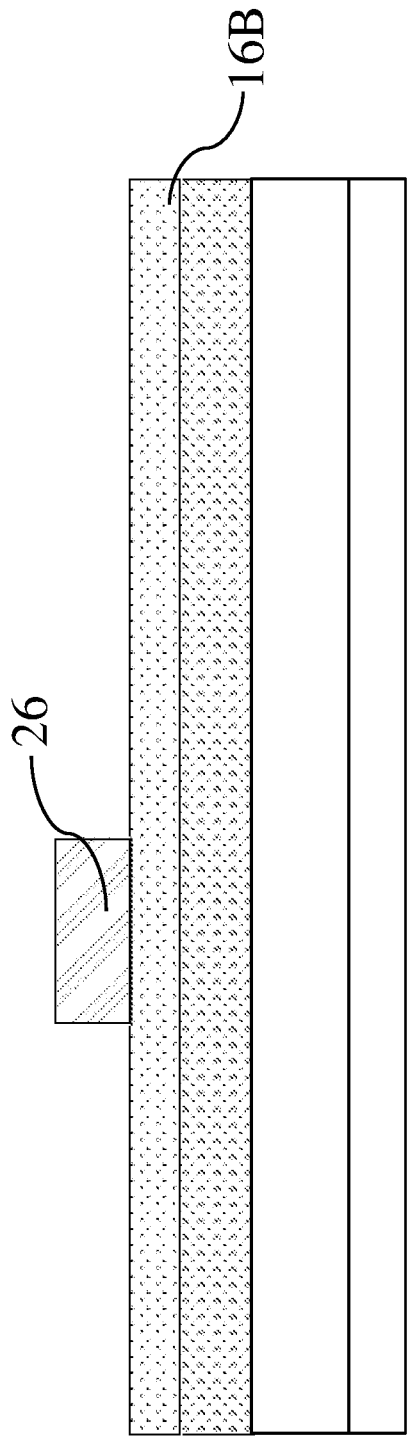
Figure 5D:
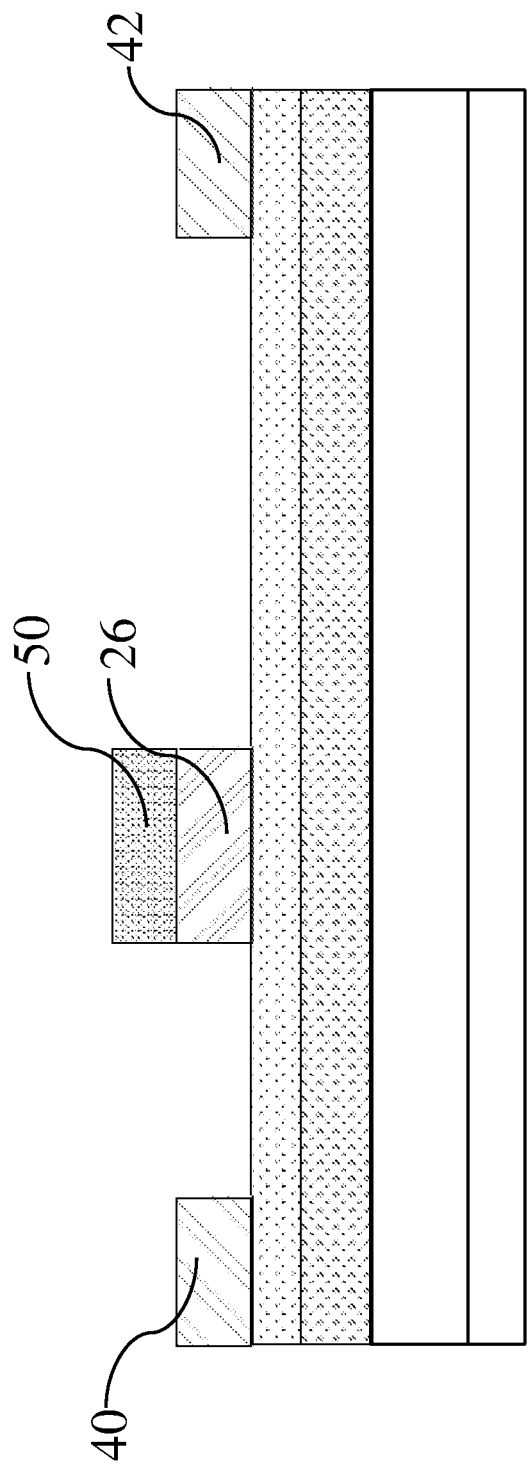

Referring to FIG. 5C, the hydrogen absorption layer 96 is removed, so as to expose the top surface of the blanket p-type doped nitride-based semiconductor layer 94. In some embodiments, at least one hydrogen absorption island remains on the blanket p-type doped nitride-based semiconductor layer 94 after removing the hydrogen absorption layer 96. Thereafter, the blanket p-type doped nitride-based semiconductor layer 94 is patterned to form a p-type doped nitride-based semiconductor layer 26 on/over/above the nitride-based semiconductor layer 16B Referring to FIG. 5D, electrodes 40 and 42 are formed on/over/above the nitride-based semiconductor layer 16A. A gate electrode 50 is formed on/over/above the p-type doped nitride-based semiconductor layer 22. Thereafter, a passivation layer 60 can be formed, obtaining the configuration of the semiconductor device 1B as shown in FIG. 5D.

Based on the above, in the embodiments of the present disclosure, the hydrogen absorption layer can be formed on the inactivate or low activate p-type doped nitride-based semiconductor layer to activate the p-type dopant therein, and thus more holes can be released. Moreover, the distribution of hole concentration can be modified, which is suitable for forming good contact with an electrode. Since the properties/characters of the hydrogen absorption layer is compatible with HEMT/HHMT devices, such the manner can be optionally applied to structures of HEMT/HHMT devices. The present disclosure is to provide how to specifically constitute a HHMT device applying hydrogen absorption islands into the structure thereof for the purpose of improvement to hole concentration. As such, the semiconductor device including the HEMT or HHMT device can have good electrical properties.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 μm or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device comprising:
a first nitride-based semiconductor layer;
a second nitride-based semiconductor layer disposed on the first nitride-based semiconductor layer and having a bandgap different than a bandgap of the first nitride-based semiconductor layer to form a heterojunction therebetween;
a first p-type doped nitride-based semiconductor layer disposed above the second nitride-based semiconductor layer and having a bottom surface in contact with the second nitride-based semiconductor layer, wherein the first p-type doped nitride-based semiconductor layer has a hydrogen concentration which decrementally decreases along a direction pointing from the bottom surface toward a top surface of the first p-type doped nitride-based semiconductor layer;
a first electrode disposed on the first p-type doped nitride-based semiconductor layer and in contact with the top surface of the first p-type doped nitride-based semiconductor layer; and
a second electrode disposed above the second nitride-based semiconductor layer to define a drift region.

2. The semiconductor device of claim 1, further comprising:
a hydrogen absorption island disposed between the first p-type doped nitride-based semiconductor layer and the first electrode.

3. The semiconductor device of claim 2, wherein the hydrogen absorption island comprises Ti, Zr, Ca, Mg, V, Nb, Re, or combinations thereof.

4. The semiconductor device of claim 2, wherein the hydrogen absorption island comprises $KHCO_3$, $NaHCO_3$, $Li_3N$, or combinations thereof.

5. The semiconductor device of claim 2, wherein the hydrogen absorption island comprises Al—Ni nanoparticles.

6. The semiconductor device of claim 2, wherein the hydrogen absorption island comprises activated carbon, graphitized carbon nanofiber, carbon nanotube, or combinations thereof.

7. The semiconductor device of claim 2, wherein the hydrogen absorption island comprises gas hydrates.

8. The semiconductor device of claim 2, wherein the hydrogen absorption island stores hydrogen inside.

9. The semiconductor device of claim 2, wherein the hydrogen absorption island comprises metal hydride.

10. The semiconductor device of claim 1, wherein the first p-type doped nitride-based semiconductor layer comprises Mg—H complexes which are decreasingly distributed from the bottom surface to the top surface.

11. The semiconductor device of claim 1, wherein the hydrogen concentration of the first p-type doped nitride-based semiconductor layer is horizontally uniform at the top surface.

12. The semiconductor device of claim 1, further comprising:
a second p-type doped nitride-based semiconductor layer disposed above the second nitride-based semiconductor layer, wherein a hydrogen concentration of the second p-type doped nitride-based semiconductor layer decrementally decreases along the direction; and a third electrode disposed on and in contact with the second p-type doped nitride-based semiconductor layer.

13. The semiconductor device of claim 1, wherein the bandgap of the second nitride-based semiconductor layer is greater than the bandgap of the first nitride-based semiconductor layer, such that heterojunction is formed with a two-dimensional electron gas (2DEG) region.

14. The semiconductor device of claim 1, wherein the bandgap of the second nitride-based semiconductor layer is less than the bandgap of the first nitride-based semiconductor layer, such that heterojunction is formed with a two-dimensional hole gas (2DHG) region.

15. The semiconductor device of claim 1, further comprising:
a hydrogen absorption thin film disposed between the first p-type doped nitride-based semiconductor layer and the first electrode and electrically connecting the first p-type doped nitride-based semiconductor layer to the first electrode.

16. A method for manufacturing a semiconductor device, comprising:
forming a first nitride-based semiconductor layer;
forming a second nitride-based semiconductor layer on the first nitride-based semiconductor layer to form a heterojunction therebetween;
forming a blanket p-type doped nitride-based semiconductor layer above the second nitride-based semiconductor layer;
forming a hydrogen absorption layer above the blanket p-type doped nitride-based semiconductor layer;
varying a process temperature such that hydrogen in the blanket p-type doped nitride-based semiconductor layer is absorbed by the hydrogen absorption layer;
removing the hydrogen absorption layer;
patterning the blanket p-type doped nitride-based semiconductor layer to form a p-type doped nitride-based semiconductor layer; and
forming a first electrode in contact with the p-type doped nitride-based semiconductor layer;

wherein the p-type doped nitride-based semiconductor layer has a hydrogen concentration which decrementally decreases along a direction pointing from the bottom surface toward a top surface of the p-type doped nitride-based semiconductor layer.

17. The method of claim 16, wherein at least one hydrogen absorption island remains on the p-type doped nitride-based semiconductor layer after removing the hydrogen absorption layer.

18. The method of claim 16, wherein the hydrogen absorption layer comprises metal hydride after varying the process temperature.

19. The method of claim 16, further comprising:
forming a second electrode above the second nitride-based semiconductor layer to define a drift region between the first and second electrodes.

20. A method for manufacturing a semiconductor device, comprising:
forming a first nitride-based semiconductor layer;
forming a second nitride-based semiconductor layer on the first nitride-based semiconductor layer to form a heterojunction therebetween;
forming a blanket p-type doped nitride-based semiconductor layer above the second nitride-based semiconductor layer;
forming a hydrogen absorption layer above the blanket p-type doped nitride-based semiconductor layer;
varying a process temperature such that hydrogen in the blanket p-type doped nitride-based semiconductor layer is absorbed by the hydrogen absorption layer;
removing the hydrogen absorption layer;
patterning the blanket p-type doped nitride-based semiconductor layer to form a p-type doped nitride-based semiconductor layer; and
forming a first electrode in contact with the p-type doped nitride-based semiconductor layer;
wherein at least one hydrogen absorption island remains on the p-type doped nitride-based semiconductor layer after removing the hydrogen absorption layer.

* * * * *